United States Patent
Piracha et al.

(10) Patent No.: US 10,119,201 B2
(45) Date of Patent: Nov. 6, 2018

(54) METHOD OF FABRICATING A DIAMOND MEMBRANE

(71) Applicant: The University of Melbourne, Victoria (AU)

(72) Inventors: Afaq Habib Piracha, Victoria (AU); Steven Prawer, Victoria (AU); Kumaravelu Ganesan, Victoria (AU); Snjezana Tomljenovic-Hanic, Victoria (AU); Desmond Lau, Victoria (AU)

(73) Assignee: The University of Melbourne, Melbourne, Victoria (AU)

( * ) Notice: Subject to any disclaimer, the term of this patent is extended or adjusted under 35 U.S.C. 154(b) by 0 days.

(21) Appl. No.: 15/519,220

(22) PCT Filed: Oct. 15, 2015

(86) PCT No.: PCT/AU2015/000625
§ 371 (c)(1),
(2) Date: Apr. 14, 2017

(87) PCT Pub. No.: WO2016/058037
PCT Pub. Date: Apr. 21, 2016

(65) Prior Publication Data
US 2017/0233891 A1   Aug. 17, 2017

(30) Foreign Application Priority Data

Oct. 15, 2014 (AU) ................................ 2014904125
Oct. 17, 2014 (AU) ................................ 2014904171

(51) Int. Cl.
*C03C 15/00* (2006.01)
*C03C 25/68* (2006.01)
(Continued)

(52) U.S. Cl.
CPC .......... *C30B 25/20* (2013.01); *B23K 26/0006* (2013.01); *B23K 26/362* (2013.01);
(Continued)

(58) Field of Classification Search
CPC .... B23K 26/362; B23K 26/0006; C30B 25/20
See application file for complete search history.

(56) References Cited

U.S. PATENT DOCUMENTS

2012/0302045 A1* 11/2012 Yamada ............... C23C 14/0605
                                                     438/478
2013/0043213 A1*  2/2013 Liao ..................... B81C 1/0015
                                                     216/79
(Continued)

FOREIGN PATENT DOCUMENTS

GB        2288272     11/1997
JP      2012-051793    3/2012
(Continued)

OTHER PUBLICATIONS

Magyar et al., "Fabrication of Thin, Luminescent, Single-crystal Diamond Membranes", Applied Physics Letters, 99, 081913, Aug. 24, 2011.
(Continued)

*Primary Examiner* — Thomas T Pham
(74) *Attorney, Agent, or Firm* — Michael Best & Friedrich LLP

(57) ABSTRACT

The present disclosure provides a method of fabricating a diamond membrane. The method comprises providing a substrate and a support structure. The substrate comprises a diamond material having a first surface and the substrate further comprises a sub-surface layer that is positioned below the first surface and has a crystallographic structure that is different to that of the diamond material. The sub-surface layer is positioned to divide the diamond material
(Continued)

into first and second regions wherein the first region is positioned between the first surface and the sub-surface layer. The support structure also comprises a diamond material and is connected to, and covers a portion of, the first surface of the substrate. The method further comprises selectively removing the second region of the diamond material from the substrate by etching away at least a portion of the sub-surface layer of the substrate.

14 Claims, 15 Drawing Sheets

(51) Int. Cl.
| | |
|---|---|
| *C03C 25/00* | (2018.01) |
| *B23P 15/00* | (2006.01) |
| *C23F 1/00* | (2006.01) |
| *C30B 25/20* | (2006.01) |
| *C30B 25/04* | (2006.01) |
| *C30B 29/04* | (2006.01) |
| *C30B 25/18* | (2006.01) |
| *C23C 16/04* | (2006.01) |
| *C23C 16/27* | (2006.01) |
| *B23K 26/00* | (2014.01) |
| *B23K 26/362* | (2014.01) |
| *B81C 3/00* | (2006.01) |
| *C23C 16/44* | (2006.01) |
| *C23C 16/56* | (2006.01) |
| *C25F 3/02* | (2006.01) |
| *C30B 33/10* | (2006.01) |
| *C30B 33/12* | (2006.01) |
| *B23K 103/00* | (2006.01) |

(52) U.S. Cl.
CPC ............ *B81C 3/001* (2013.01); *C23C 16/042* (2013.01); *C23C 16/274* (2013.01); *C23C 16/279* (2013.01); *C23C 16/4408* (2013.01); *C23C 16/56* (2013.01); *C25F 3/02* (2013.01); *C30B 25/04* (2013.01); *C30B 25/18* (2013.01); *C30B 29/04* (2013.01); *C30B 33/10* (2013.01); *C30B 33/12* (2013.01); *B23K 2203/50* (2015.10); *B81C 2201/0143* (2013.01); *B81C 2201/0146* (2013.01); *B81C 2201/0187* (2013.01); *B81C 2201/0198* (2013.01)

(56) References Cited

U.S. PATENT DOCUMENTS

2013/0334170 A1* 12/2013 Englund ................. C30B 29/04
 216/51
2015/0069329 A1* 3/2015 Jeon ................. G01N 33/48721
 257/29

FOREIGN PATENT DOCUMENTS

| WO | 2006076354 | 7/2006 |
| WO | 2012159896 | 11/2012 |

OTHER PUBLICATIONS

International Search Report and Written Opinion for International Application No. PCT/AU2015/000625, dated Dec. 23, 2015, 9 pages.

* cited by examiner

METHOD OF FABRICATING A DIAMOND MEMBRANE

FIELD OF THE INVENTION

The present invention relates to a method of fabricating a diamond membrane. The invention further relates to a device comprising a diamond membrane fabricated by the method.

BACKGROUND OF THE INVENTION

High quality thin diamond membranes that may have a thickness in the sub-micron range are of growing interest for a number of device applications, such as single photon sources, and quantum information processing devices.

A conventional process for fabricating such thin membranes includes chemical vapour deposition in connection with mechanical polishing and chemical etching. However, the quality of the thin diamond membranes fabricated by this process is often insufficient as such membranes usually have non-uniform thickness and relatively high surface roughness.

Other techniques, such as ion implantation and lift off, may be used to fabricate free-standing thin diamond membranes. However, these techniques introduce a residual built-in strain and damage resulting in membranes that are vulnerable to breakage and bowing which undermines subsequent processing of the membranes and degrades wave guiding properties and the quality of optical centres of the membranes.

There is need for improvement.

SUMMARY OF THE INVENTION

In accordance with a first aspect, there is provided a method of fabricating a diamond membrane, the method comprising:

provide a substrate and a support structure, the substrate comprising a diamond material having a first surface, the substrate further comprising a sub-surface layer that is positioned below the first surface and has a crystallographic structure that is different to that of the diamond material, the sub-surface layer being positioned to divide the diamond material into first and second regions wherein the first region is positioned between the first surface and the sub-surface layer, the support structure also comprising a diamond material and being connected to, and covering a portion of, the first surface of the substrate; and selectively removing the second region of the diamond material from the substrate by etching away at least a portion of the sub-surface layer of the substrate.

Throughout this specification the term "diamond material" is used for films or bulk materials of single-crystalline diamond material, poly-crystalline diamond material, nano-crystalline diamond material and also for diamond-like materials including diamond glassy carbon and diamond-like carbon materials.

Further, throughout this specification the term "membrane" is used for a relatively thin sheet of a material.

Providing the substrate may comprise growing a layer of substantially single-crystalline diamond material on the diamond material of the substrate such that a surface of the substantially single-crystalline diamond layer forms the first surface of the substrate.

In a first embodiment the method comprises providing diamond material for forming the support structure. The diamond material may have apertures. Providing the diamond material may comprise providing a sheet of the diamond material and forming the apertures using laser milling or another suitable technique. Further, the method may comprise coupling the provided diamond material to the first surface of the substrate in a manner such that portions of the first surface are exposed within the apertures of the provided diamond material. Coupling of the formed support structure to the first surface of the substrate may be effected by virtue of surface tension and/or Van der Walls forces. The method may further comprise forming further diamond material on the first surface within apertures of the support structure to fuse the support structure to the substrate. The further diamond material may be substantially single-crystalline.

In a variation of the first embodiment of the present invention, providing the diamond material for forming the support structure comprises providing a sheet of the diamond material and forming recesses, or recesses and apertures, using laser milling or another suitable technique. The recesses may be formed such that the recesses penetrate through 50%, 60%, 70%, 80%, 90% or more of the thickness of the sheet of the diamond material. In one specific example the sheet of the diamond material is formed such that the sheet comprises both apertures that penetrate through the diamond sheet and the recesses that do not penetrate through the sheet of the diamond material. In this variation coupling of the formed support structure to the first surface of the substrate comprises positioning the support structure on the first surface in a manner such that bottom portion of the recesses of the support structure are located at an exposed face of the support structure. Coupling may be effected by virtue of surface tension and/or Van der Walls forces. The method may further comprise forming further diamond material on the first surface within apertures of the support structure or around the support structure to fuse the support structure to the substrate. The further diamond material may be substantially single-crystalline. The method in accordance with this variation may further comprise subsequently removing the exposed bottoms of the recesses (for example by careful laser milling). As will be evident from the further description below, this variation of the first embodiment provides the specific advantage that the bottom portions of the recesses form protective lid portions that protect the surface of the first region of the substrate (and consequently the substantially single-crystalline diamond layer that may be at the first surface) during further processing, which makes diamond membranes that may be formed in accordance with this variation particularly suitable for (optical) applications that require high quality diamond membranes.

In a second embodiment the method comprises depositing the support structure on the substrate. The method may comprise providing a mask having a plurality of apertures and placing the mask on the first surface of the substrate such that portions of the first surface are exposed within the apertures. The method may further comprise growing further diamond material on the first surface of the substrate and within the plurality of apertures of the mask to form the support structure. In addition, the method may comprise removing the mask after growing the further diamond material. The mask may comprise diamond material that is polycrystalline.

In a third embodiment the method comprises depositing a further material, such as a metallic material, on the first surface of the substrate to form a mask, such as a mask having apertures. In one example, the mask comprises platinum. In a further example, the mask additionally comprises a material that forms a relatively strong bond with the diamond material, such as chromium or titanium. The method may comprise growing further diamond material on the first surface of the substrate and within apertures of the mask to form the support structure. Growing the further diamond material may be conducted such that the further diamond material is substantially single-crystalline diamond within apertures of the mask and polycrystalline diamond material forms on surface portions of the mask. The method may further comprise removing the mask, for example by etching, and any diamond material that formed on the mask.

In either embodiment the method may also comprise removing at least a portion of the first region or the entire first region of the diamond material of the substrate after removal of the second region of the diamond material of the substrate. The method in accordance with embodiments of the invention provides advantages. In these embodiments the diamond support structure is connected to the formed thin diamond membrane and provides a diamond scaffold for supporting the diamond membrane. This facilitates handling of the thin diamond membrane and avoids breaking of the diamond membrane during processing for device fabrication. A thickness of the diamond support structure can be significantly larger (such as 100 μm or more) than the thickness of the diamond membrane, which may have a thickness in the sub-micron range (such as of the order of only 300 nm). Further, embodiments of the present invention have the advantage that they are suitable for large scale production at relatively low cost. Further, as method in accordance with embodiments of the present invention have the advantage that large portions of the original diamond substrate, which do not form a part of the formed diamond membrane, can be reused multiple times, which further reduces cost.

The diamond membrane in accordance with embodiments is grown on a diamond substrate, which is then removed and consequently does not form a part of the formed diamond membrane. It follows that diamond substrates of lesser quality may be used for forming high quality diamond membranes, which may result in a further cost advantage.

The step of providing the substrate may comprise:
providing a diamond material; and
forming the sub-surface layer by imposing a structural transformation on the crystallographic structure of the diamond material.

For example, the structural transformation may be imposed by damaging the crystallographic structure of the diamond material using ion bombardment. Additionally, the method may comprise annealing the substrate after imposing the structural transformation. Ion bombardment and annealing conditions may be selected such that graphite is formed within the sub-surface layer.

The step of providing the substrate may also comprise growing further diamond material on the provided diamond material using chemical vapour deposition. The step of growing further diamond material is typically conducted after imposing the structural transformation and annealing the substrate. The step of growing the further diamond material may be conducted such that a thickness of the fabricated diamond membrane can be controlled.

The diamond membrane may have $NV^-$ centres for which the wavelength of the emitted light may be 637 nm and the refractive index of diamond material approximately is 2.4.

In one specific embodiment the thickness of the diamond membrane is in the order of a ratio between the wavelength and a refractive index of the diamond material. In this example the thickness of the diamond membrane may be in the order defined to be approximately 0.3 μm. A suitable support structure may have a thickness in a range of 150-300 μm. The membrane may also host other optical centres, including but not limited to SiV, Cr related centres and other centres.

In embodiments of the present invention the first and/or the second region of the substrate may be substantially single-crystalline. The diamond material of substrate may be substantially single crystalline. The support structure may also have a substantially single-crystalline structure. Alternatively, the diamond material of the support structure may be poly-crystalline.

In accordance with a second aspect of the present invention, there is provided a diamond membrane fabricated by the method in accordance with the first aspect of the present invention.

In accordance with further aspect of the present invention, there is provided a device comprising a diamond membrane fabricated in accordance with the first aspect of the present invention. The device may be a quantum information processing device, a NEMS or MEMS device, an optical waveguide, a microcavity, a beam splitter, an integrated electro-optomechanical device, a sensor (such as biosensor, pressure sensor, chemical sensor or others) or the like.

The invention will be more fully understood from the following description of specific embodiments of the invention. The description is provided with reference to the accompanying drawings.

DETAILED DESCRIPTION OF SPECIFIC EMBODIMENTS

Embodiments of the invention relate to a method of fabricating a membrane of diamond material that is supported by a support structure having apertures. In particular, a plurality of membrane portions of single crystalline diamond material may be fabricated and each membrane portion may be at a respective aperture.

Figure 1:
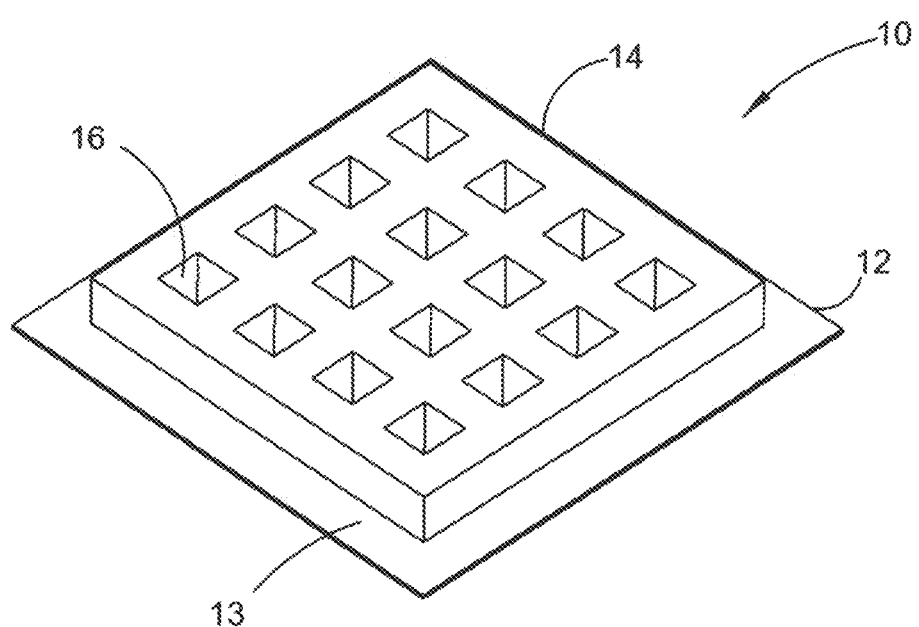
FIG. 1 is a schematic representation of a diamond membrane and a support structure in accordance with an embodiment of the present invention.

An example of a membrane of diamond material that is fabricated by a method in accordance with an embodiment of the invention is illustrated in FIG. 1. In this particular example, there is shown an assembly 10 comprising a diamond membrane 12 that is connected to a first surface 13 of a diamond support structure 14. The diamond support structure 14 has a plurality of apertures 16. In this example, the diamond membrane 12 has a thickness of approximately 0.3 μm, whereas the support scaffold 14 has a thickness in a range of 150-300 μm. These dimensions are particularly advantageous for specific optical applications in which it is required to fabricate a diamond membrane that has high quality colour centres and has a thickness in the sub-micron range. These applications include quantum photonics, sensing, micro electro-mechanical systems (MEMS) and a diverse range of other applications.

For example, for single mode waveguide or single photon source applications the thickness of the diamond membrane is important. It may be important to provide a membrane having a thickness of the order of $\lambda/n$, where n is the refractive index of the diamond which is approximately 2.4 and $\lambda=637$ nm is the wavelength where the red emission from the most commonly used optical centres in diamond. For example, single photon emitters in photonic crystal cavities or waveguides require diamond membranes that possess a suitable number of NV– centres close to the surface and that have a thickness of approximately 300 nm.

The method in accordance with embodiments of the present invention comprises a step of providing a substrate with a support structure connected to a first surface of the substrate. In specific embodiments of the present invention (which will be described below in further detail) the support structure is either grown on the substrate or is at least partially formed elsewhere and then coupled to the substrate.

The support structure comprises a diamond material, such as polycrystalline or single-crystalline diamond material, with a plurality of apertures.

The substrate comprises a sub-surface layer that has a crystallographic structure that is different to that of the diamond material. This sub-surface layer is positioned to divide the diamond material of the substrate in first and second regions and is later etched away. In this way, a second region of the diamond material of the substrate is then removed and only a first region (originally positioned between the first surface and the sub-surface layer) remains. Thus, the first region of diamond material remains that is connected to the support structure. A portion of the first region of diamond may additionally be removed after the sub-surface layer is etched away to thin the fabricated diamond membrane.

The method may allow fabrication of large area, high-optical quality ultra-thin single-crystalline diamond membranes that can span a wide variety of applications including for example compact and high-efficiency radiation sensors, radiation hard electronics, electric field emitters, diamond micromechanical devices, high-temperature, high-voltage, high-frequency electro-optics, magnetic and electric field sensors (bio, chemical, pressure), spin-based clocks, quantum information processing and communication devices. Furthermore, the chemical inertness and bio-compatibility of diamond material (in particular the resistance of the diamond material to body fluids) enable applications in biosensing for cellular and neural activities.

For more details concerning the biocompatibility of the diamond material reference is being made to the following prior publication: Fox K et al., J Mater Sci: Mater Med (2013) 24:849-861.

Other applications may include high energy applications, ion beam diagnostics and positioning, mass spectrometers, MEMS resonators, particle detector windows (UV, X-ray, electron beam, synchrotron), high energy/power lasers, X-ray diffraction windows, RAMAN detector windows, vertical-external-cavity surface-emitting-laser (VECSEL) and beam splitters.

By providing a diamond membrane connected to a support structure, not only bowing of the membrane can be overcome but flipping and handling of the membrane can be simplified.

Referring now to FIGS. 2 to 9, there are shown illustrations of method steps of methods 100, 150, 200, 300, 400 in accordance with embodiments of the present invention. It should be noted that the embodiments shown in FIGS. 2 to 9 have method steps 101, 102, 103 and method steps 107, 108, 109 in common.

In the following, the first three method steps 101, 102, 103 will be described for the embodiments that are illustrated in FIGS. 2 to 9.

Method steps 101, 102, 103 provide a substrate comprising diamond material 120 and having a sub-surface layer. In these particular embodiments, the diamond material 120 is substantially single-crystalline, but a person skilled in the art will appreciate that other types of diamond material can be used. The provided diamond material 120 has the dimensions 3 mm×3 mm×0.3 mm and is a Type IIA single crystalline diamond material that is grown using chemical vapour deposition. The sub-surface layer is created by imposing a structural transformation on the crystallographic structure of the diamond material 120. In this particular example, the diamond material is bombarded with high energy Helium ions 122 with a flux of $5\times10^{16}$ ions/cm$^2$ at 1 MeV to create a relatively thin damage layer 1.7 μm deep from the diamond surface, as shown in step 101 in FIGS. 2 to 9. A person skilled in the art will appreciate that other suitable ion bombardment conditions are envisaged.

In this example MeV ion implantation is conducted using the a 5U NEC Pelletron accelerator. In order to achieve an optimum uniform ion flux, the beam is focused to a millimeter spot size, and scanned via magnetic coils. The beam current is approximately 0.3 mA and the implantation process of the 3 mm×3 mm area of diamond material 120 typically requires approximately 90 min to achieve a flux of $5\times10^{16}$ ions/cm$^2$. It is known that high energy MeV ions bombarded into a diamond substrate (sp3-bonded carbon) produce a high-damage region at the end of their range, and bonds broken by ion impact may rearrange into a sp2-bonded structure. Dependent on implantation parameters, such as dose, energy, species, and temperature, the structure of the sub-surface layer may be controlled at a controlled depth from the surface of the diamond material. However, a person skilled in the art will appreciate that other suitable implementations are envisaged.

In step 102 as shown in FIGS. 2 to 9, the diamond material 120 is annealed at a temperature of approximately 1300° C. for 1 hour to convert the amorphous sub-surface layer to a graphite-like etchable carbon layer 124.

The annealing step is performed utilising electron beam heating in an evacuated chamber, such as in a vacuum of approximately $10^{-6}$ mbar, in a graphite crucible, to provide a reducing environment and prevent high temperature oxidation. In this example, the annealed diamond material 120 was cleaned by acid boiling in a mix of concentrated sulfuric ($H_2SO_4$) and sodium nitrate ($NaNO_3$) for approximately 10 min. However, other suitable implementations are envisaged.

In a further step 103, the annealed diamond material 120 is overgrown using Microwave Plasma Chemical Vapour Deposition (MPCVD) at a growth rate of approximately 1 μm/hour yielding high quality diamond material 126 that is substantially single crystalline. The step of overgrowing the annealed diamond material 120 may be conducted to control the thickness of the fabricated final diamond membrane. The diamond material, the graphite layer 124 together with the overgrown diamond material 126 form a substrate 127.

The growth step in this particular example is performed in the IPLAS MPCVD reactor. The chamber is pumped below approximately $10^{-3}$ mbar and purged with hydrogen ($H_2$) gas. The plasma is ignited only with $H_2$. Once chamber pressure is stabilised and a desired temperature of approximately 600° C. is reached methane ($CH_4$) gas is introduced. In this embodiment, the growth conditions for the high quality single crystalline diamond growth are: microwave power approximately 3000 W, pressure approximately 100 Torr, gas mixture composition approximately 2% $CH_4$ in $H_2$. The substrate temperature was maintained at approximately 900° C. as monitored by a pyrometer. The microwave plasma is the only active source of heating. However, a person skilled in the art will appreciate that other implementations for step 103 are envisaged.

Figure 2:
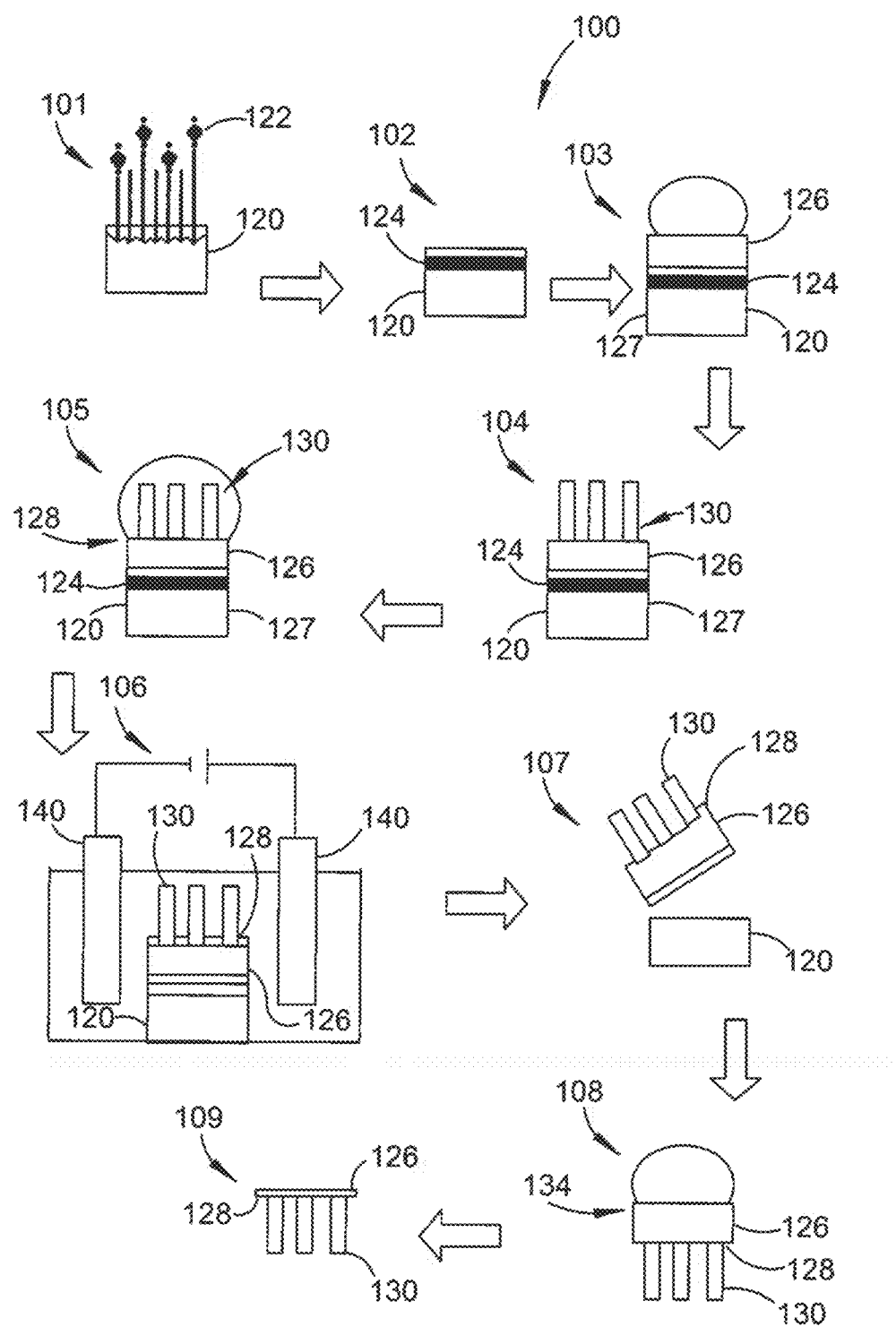
FIGS. 2 to 5 are illustrations of a method of fabricating a diamond membrane in accordance with an embodiment of the present invention.
Figure 3:
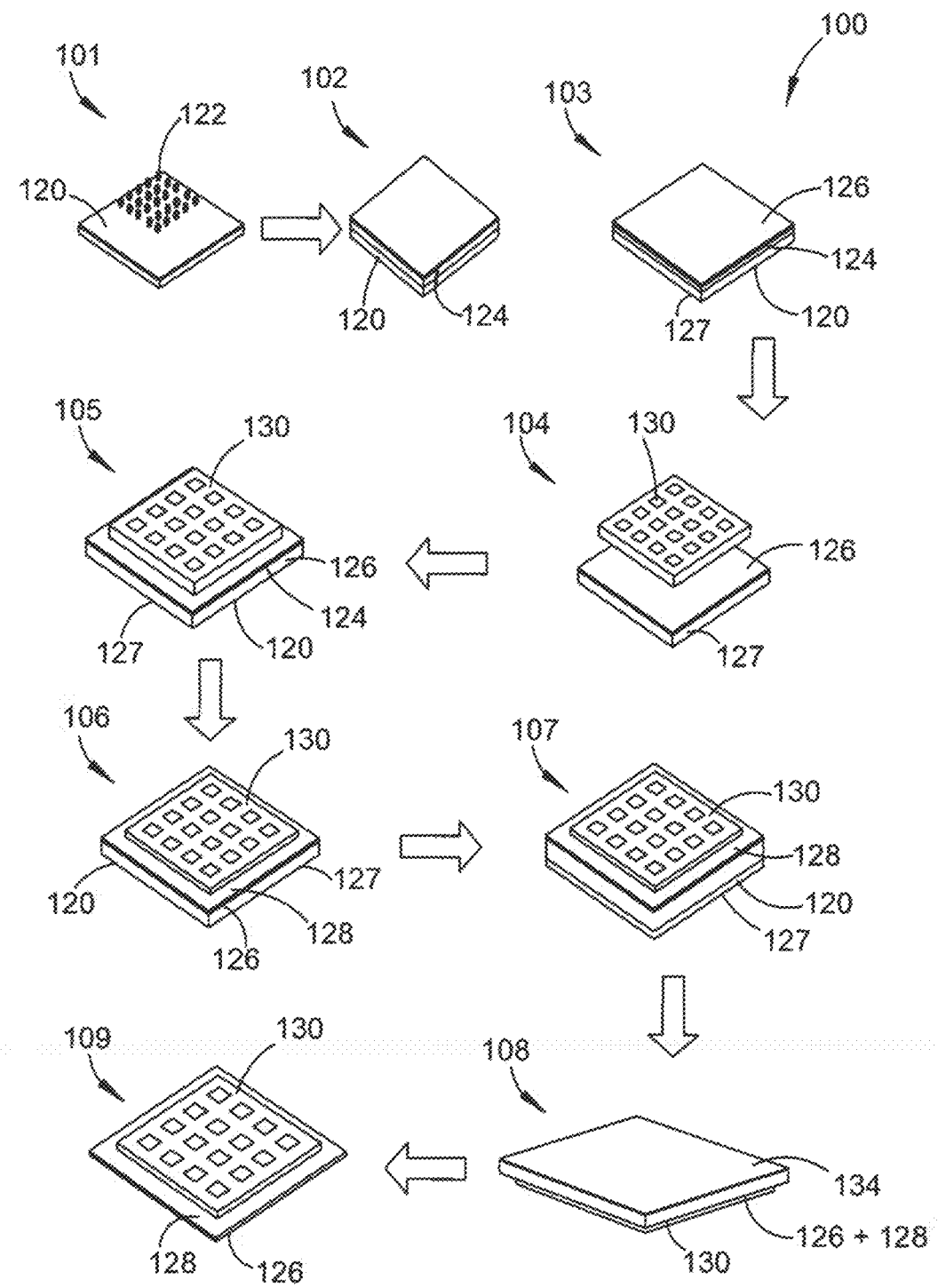

Referring now to FIGS. 2 and 3, there are illustrated method steps 104 to 106 of the method 100 in accordance with a first embodiment of the present invention. Method steps 104 to 106 relate to steps in which the support structure is fused to the substrate 127.

In step 104 shown in FIGS. 2 and 3, a diamond mask 130 is formed from a diamond sheet that is patterned using laser milling to form apertures. The diamond mask 130 is then positioned on the first surface of the substrate 127 (the surface of the diamond layer 126) to form a grid-like scaffold on the first surface of the substrate 127. These patterns may be of any desired geometry and shape, such as rectangular, circular or the like. In this embodiment, a Nd-YAG laser was scanned perpendicularly to cut desired patterns into the provided diamond material following instructions of a compiled computer program. The lateral dimension of the scaffold 130 is less than that of the substrate 127 and the thickness may be in the range of 100-300 μm.

Further in step 104, the support structure 130 is placed and aligned on the first surface of the substrate 127 under a microscope. The support structure 130 is connected to the first surface of the substrate due to surface tension and Van der Walls forces of the respective diamond materials.

In step 105, the assembly of support structure 130 and diamond substrate 127 is placed in a chemical vapour deposition reactor for growing further diamond material on the assembly. In this particular example, this growing step results in the formation of selective growth of high optical quality single crystalline diamond layer 128 through the apertures of the support structure 130. Also, a bond layer of diamond material is grown between the support structure 130 and the single crystalline diamond substrate 127. In this way, the support structure 130 is fused to the first surface of the diamond layer 126 of the substrate 127 by growth of a fusion layer 128. The bond between the support structure 130 and the substrate 127 is relatively strong irrespective of mechanical force application, electrochemical and harsh acid environments. In the embodiment the method is conducted such that the steps 104 to 106 result in single crystalline diamond membrane portions within a support structure 130 of diamond material.

FIGS. 10-14 (which will be described later) show optical and electron microscopy micrographs of structures formed by a method in accordance with an embodiment of the present invention. FIG. 15 (which will also be described later) shows plots of normalised Raman data taken after different processing steps of the above-described method 100.

Figure 4:
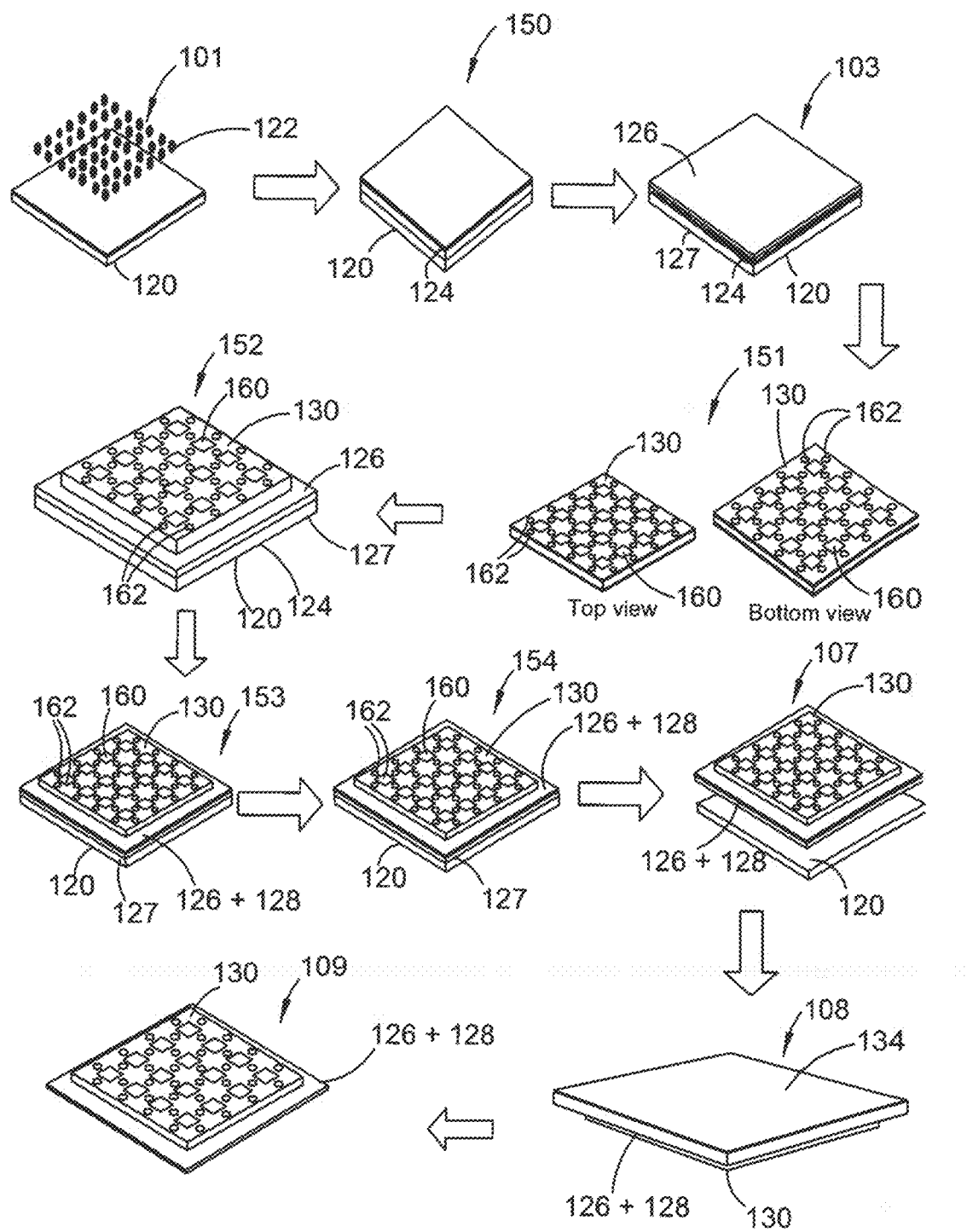

FIG. 4 illustrates steps of a method 150 in accordance with a further embodiment of the present invention. Steps 101, 102 and 103 of the method 150 have been described above. Step 151 forms a diamond support structure 130. However, in contrast to the support structure 130 that was formed by steps 104 illustrated with reference to FIGS. 2 and 3, step 151 forms the support structure 130 by laser milling a plurality portions into a diamond substrate without milling through each portion. For example, 80%-90% of the diamond material at portions 160 may be removed leaving 10%-20% of the diamond material at the bottom of the portions 160, whereas in this example the portions 162 have been milled through the diamond material. In the illustrated example the support structure 130 comprises cylindrical and rectangular portions 162. A person skilled in the art will appreciate that the portions 160 and 162 may have any suitable shape.

The support structure 130 is then flipped over and positioned on the high quality diamond material 126 of the substrate 127 in a manner such that the bottom regions of the portions 160 form lids portions over below positioned portions of the layer 126. The support structure 130 is connected to high quality diamond layer 126 by surface tension and van der Walls forces (step 152).

In step 153, the assembly of support structure 130 and the substrate 127 is placed in a chemical vapour deposition reactor for growing further diamond material on exposed regions of diamond the layer 126. In this particular example, this growing step results in the formation diamond material 128 within the portions 162 and around the support structure 130. In this way, the support structure 130 is fused to the first surface substrate 127. The formed diamond material 128 can be relatively thick resulting in a strong bond between the support structure 130 and the substrate 127.

Step 154 removes the lid portion of the portions 162 by careful low power laser milling in a manner such that underlying regions of the high quality diamond layer 126 are undamaged and, once processing is completed, can be used for high quality optical and other applications.

As mentioned above, method steps 107 to 109 are common to the embodiments illustrated with reference to FIGS. 2 to 9. Method steps 107 to 109 relate to the removal of the sub-surface layer 124 of the substrate 127.

In step 107, the assembly of the support structure 130 is immersed in a boric acid solution and the sub-surface layer 124, i.e. graphite like carbon layer 124 is electrochemically etched away under constant voltage. In this way, the second region 120 of diamond material is removed from the substrate 127. In particular, the first region of diamond material 126, 128 of the substrate together with the support structure 130 is lifted off for further processing.

An electrolytic saturated boric acid solution is prepared in deionized water with equal proportions. Two Platinum electrodes 140 are fixed as close to the assembly from both sides to for strong electric field. The assembly to be etched is bonded to a base of a glass Petri dish via suitable adhesive, and then immersed in electrolytic solution. A DC power supply is used to apply 300V and approximately 30 mA across the assembly. Once graphite like carbon layer is fully etched, the assembly is cleaned in deionized water and subsequently cleaned by acid boiling in a mix of concentrated sulphuric ($H_2SO_4$) and sodium nitrate ($NaNO_3$) for approximately 10 min, to remove any remaining graphite residue. The thin single-crystalline diamond membrane with the support structure 130 are lifted off and flipped face down for further processing. A person skilled in the art will appreciate that other suitable etching conditions are envisaged.

In the next step 108, the assembly of the support structure 130 and remaining portions of the substrate 127 are flipped over and a remaining damaged layer 134 (the damage was caused by the ion implantation in step 101) is removed using smooth material removal techniques such as reactive ion etching, ion implantation, precision polishing or other suitable techniques For the ion etching in the particular embodiment, inductive coupled plasma reactive ion etching (ICP-RIE) is used. As a consequence, the damaged layer 134 of the first region of the diamond material is fully etched away, leaving behind high optical quality, chemical vapour deposition grown single-crystalline diamond windows within a supporting diamond structure 130, as shown in step 109.

Step 108 is conducted until the final thickness of 300 nm of the diamond membrane is reached. Accordingly, a portion of the first region of diamond material 126 that is grown on the annealed substrate 120 in step 103 forms the final diamond membrane. The support structure 130 that remains connected to the diamond membrane provides the advantage that bowing of the relatively thin diamond membrane is eliminated and that handling of the diamond membrane is improved, such as flipping, transferring and further processing.

The method 150 illustrated with reference to FIG. 4 provides the particular advantage that areas of the layer 126 that are within the portions 160 of the supports structure 130 are particularly suitable for high quality device applications as theses portions were protected by lids of the portions 160 during some processing steps.

Figure 5:
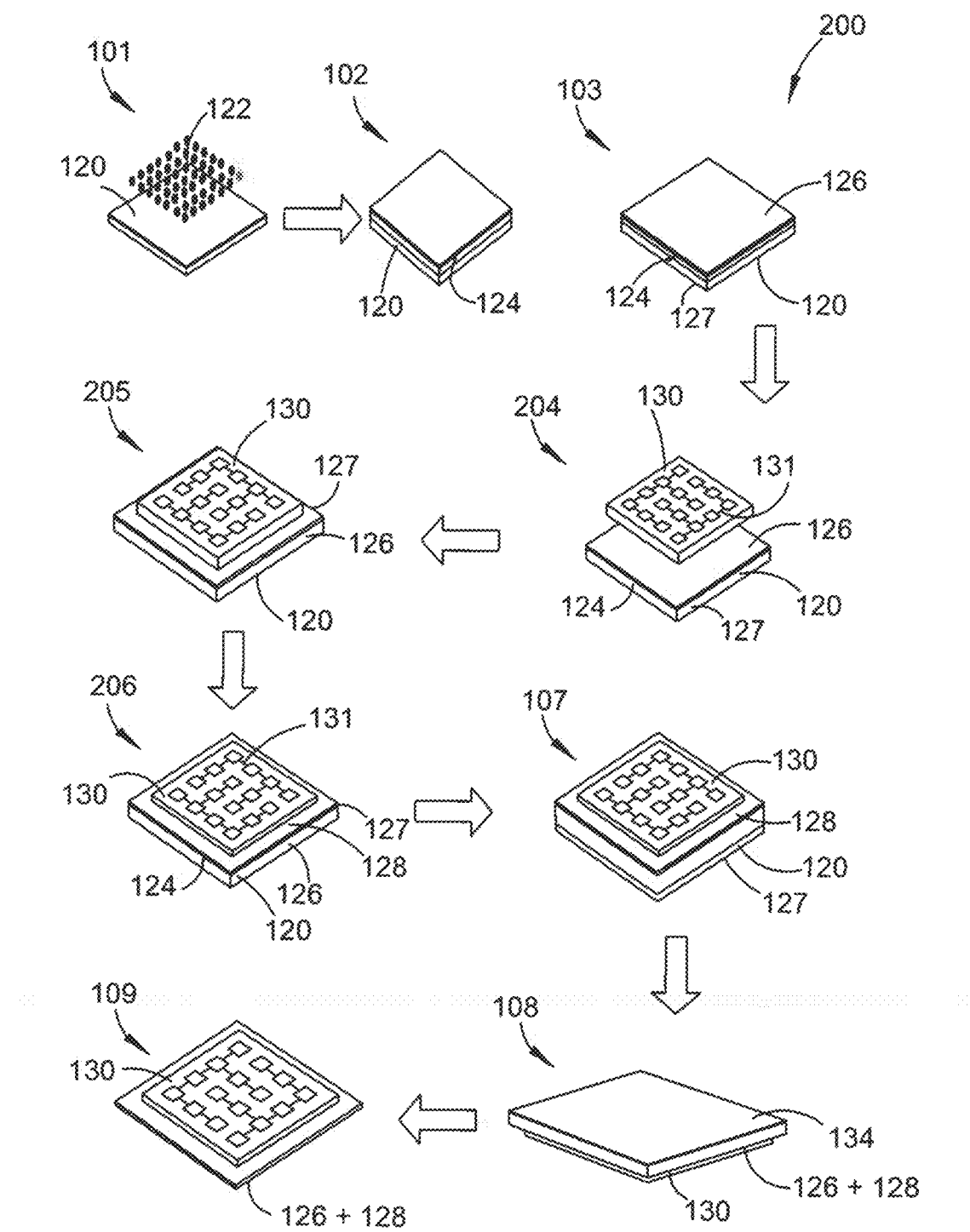

A further method 200 in accordance with a further embodiment of the invention is illustrated in FIG. 5. In this embodiment, method step 204 differs from method step 104 in that micro-channels 131 are created that connect at least some of the apertures within the support structure 130. These micro-channels 131 are used to form thin waveguiding strips.

Figure 6:
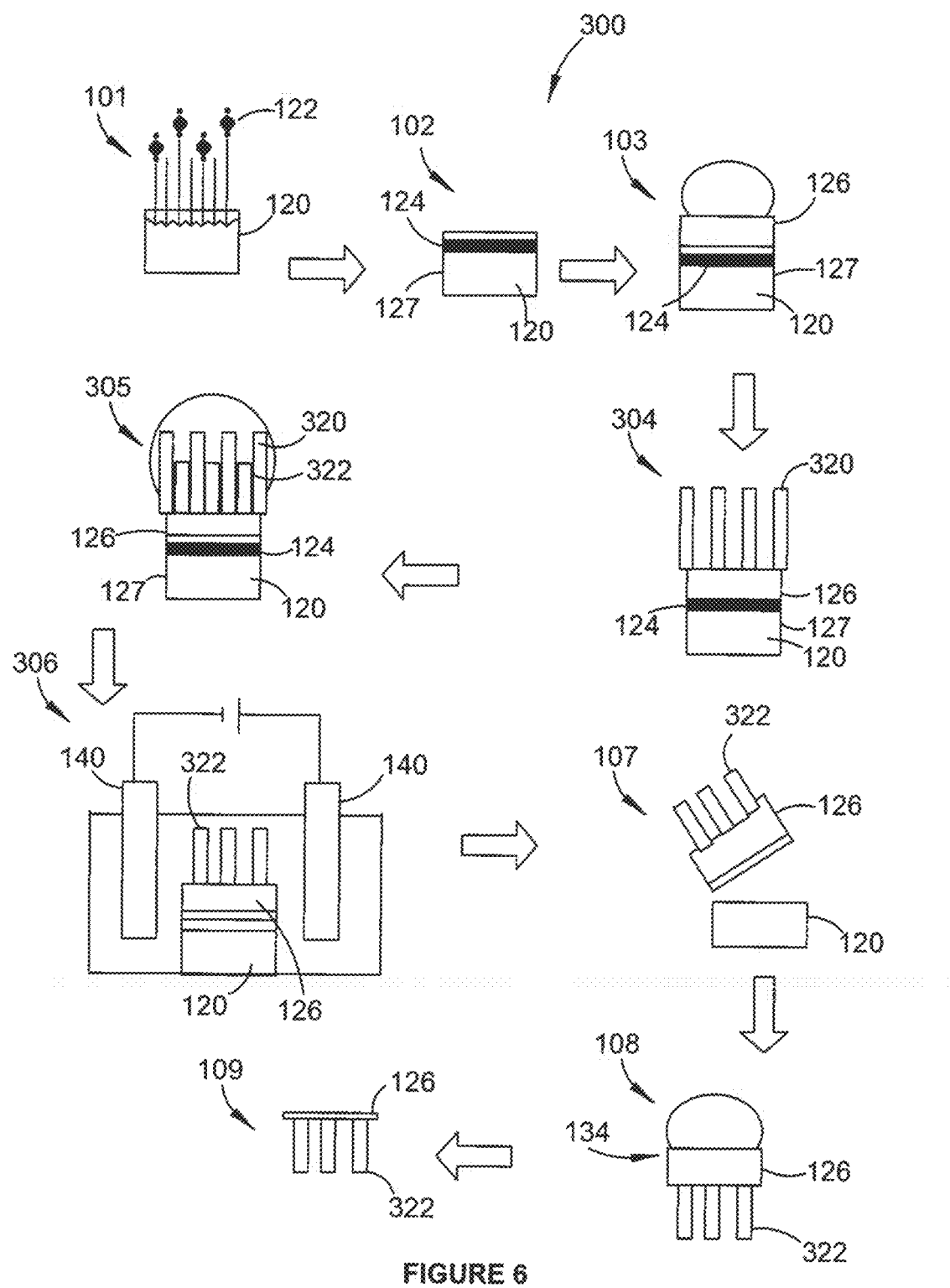
FIGS. 6 and 7 are illustrations of a method of fabricating a diamond membrane in accordance with a further embodiment of the present invention.
Figure 7:
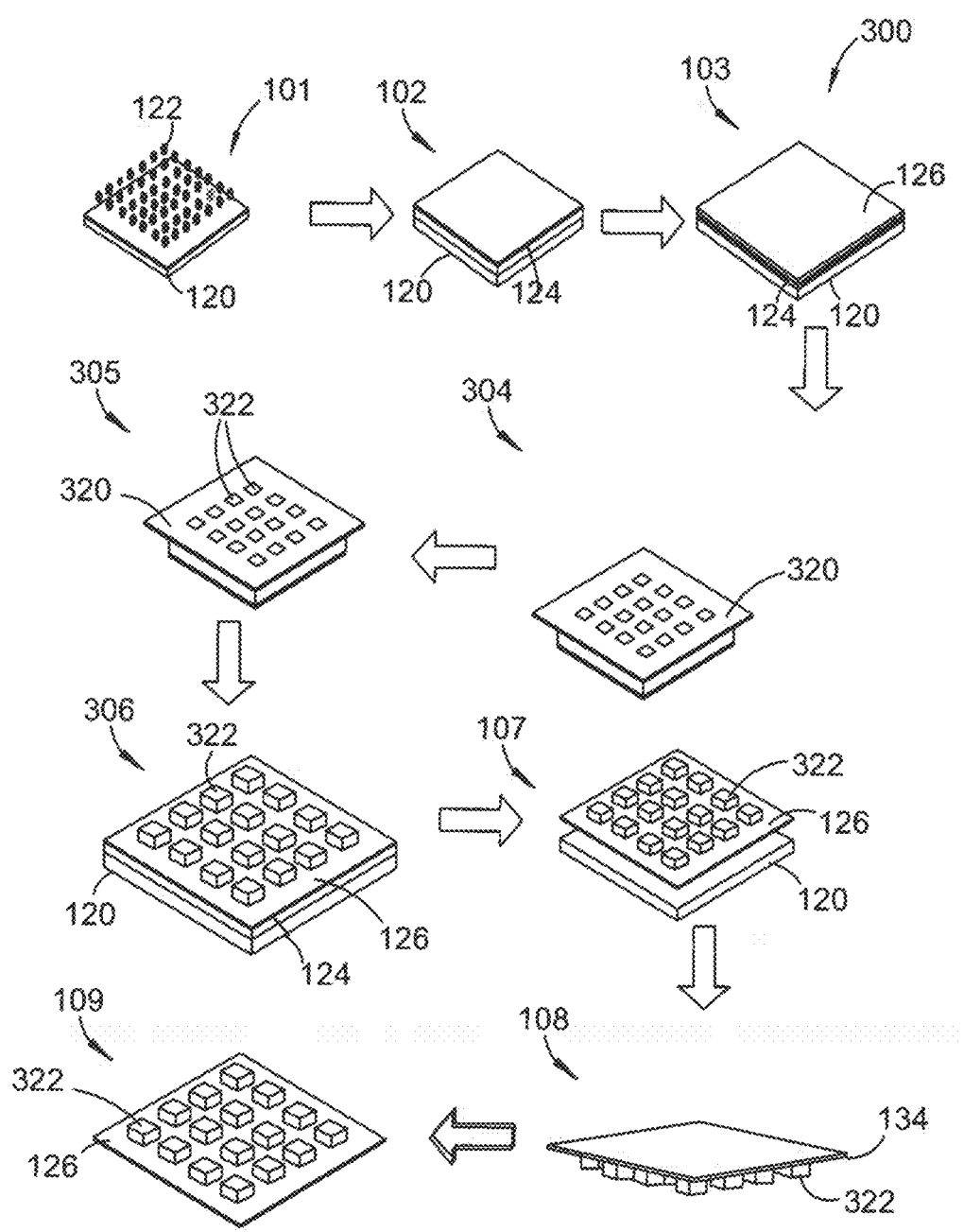

Referring now to FIGS. 6 and 7, there is illustrated a method 300 in accordance with a second embodiment of the present invention.

Following steps 101 to 103 as described with reference to FIGS. 2 to 5, steps 304 to 306 relate to growing the support structure on the substrate using a sacrificial diamond mask. A mask 320 is provided on the surface of the first region of the substrate 127. The mask 320 comprises diamond material that is substantially poly-crystalline with lateral dimensions relatively larger than the substrate 127 and with a thickness in a range of 150 µm-200 µm. A plurality of apertures is cut into the mask 320 using a laser. These apertures may be of any desired geometry and shape such as rectangular, circular or any other suitable shape. The poly-crystalline diamond mask 320 is placed physically and aligned on the surface of the first region of diamond material of the substrate 127 as shown in step 304.

In step 305, further diamond material is grown on the assembly of the poly-crystalline diamond mask and the single-crystalline diamond substrate 127 using chemical vapour deposition. This step results in the formation of selective growth of 150 µm-200 µm high single-crystalline diamond pillars 322 within the apertures of the mask 320 where the substrate is not covered by the mask. The growth of single-crystalline diamond pillars 322 may for example be achieved by developing high growth rate chemical vapour deposition recipe with addition of nitrogen.

In a further step 306, the sacrificial poly-crystalline diamond mask 320 is removed or lifted off using electrochemical etching. This results in an assembly of an array of high quality single-crystalline diamond membrane portions separated by single-crystalline diamond pillars 322.

The assembly is further processed in accordance with steps 107 to 109 as described with reference to FIGS. 2 to 5.

Figure 8:
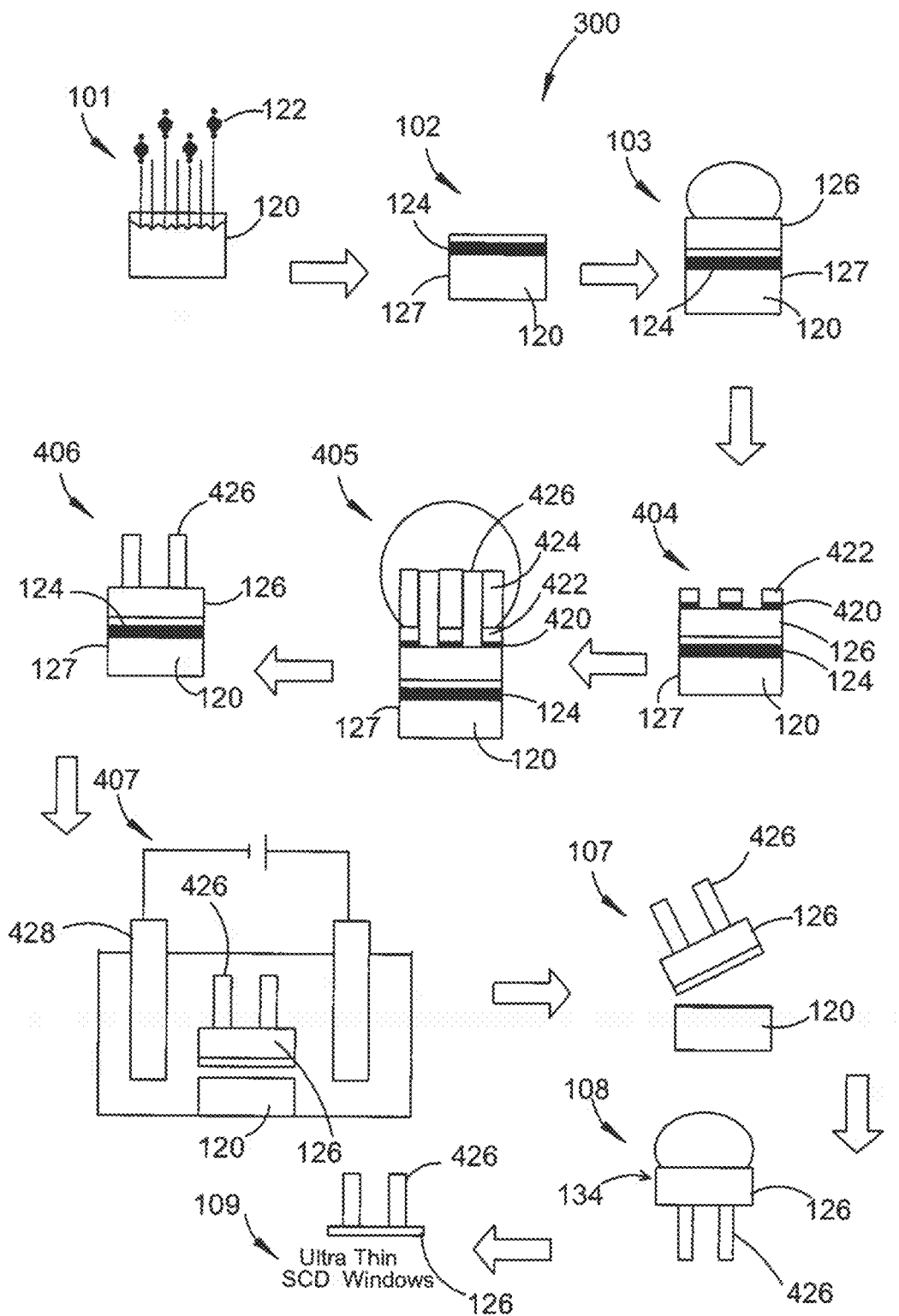
FIGS. 8 and 9 are illustrations of a method of fabricating a diamond membrane in accordance with a further embodiment of the present invention.
Figure 9:
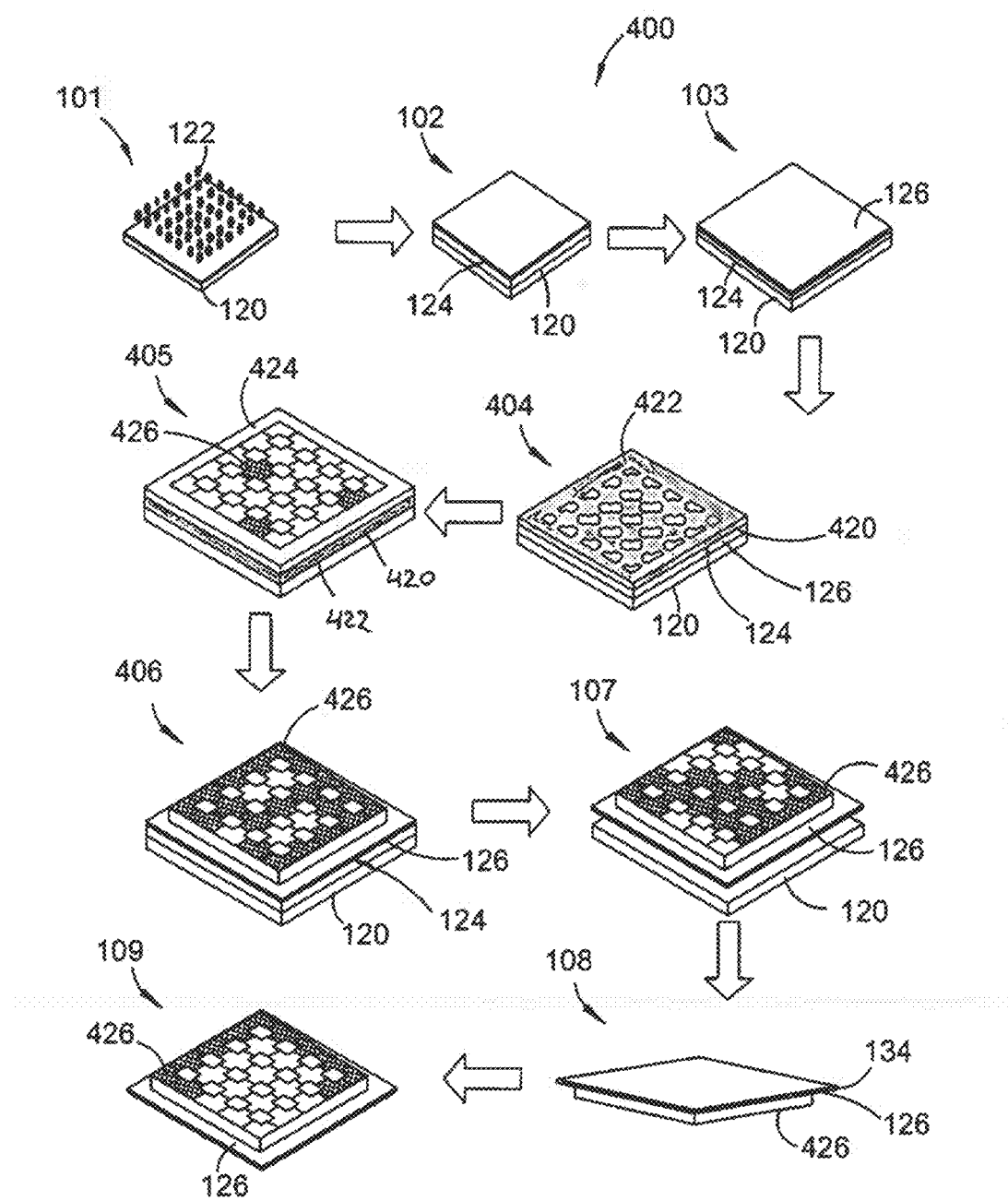

Referring now to FIGS. 8 and 9, there is illustrated a method 400 in accordance with a third embodiment of the present invention.

Following steps 101 to 103 as described with reference to FIGS. 2 to 5, method steps 404 to 406 relate to growing the support structure using a sacrificial metal mask. Specifically, a mask 420, 422 comprising a metal material is deposited on the substrate 127. In order to deposit the metal mask 420, 422 on a surface of the first region of the substrate 127, the substrate is initially patterned using lithography. In this particular embodiment, the diamond material of the substrate 127 is substantially single crystalline. The metal mask is then deposited in the form of a 300 nm bilayer of Chromium or Titanium 420 as adhesive layer on the patterned surface of the substrate and Platinum 422 as top layer using suitable deposition techniques such as electron beam evaporation. The above described method steps are illustrated in step 404 shown in FIGS. 8 and 9.

In a further step 405, further diamond material 424, 426 is grown on the assembly of the substrate 127 together with the metal mask 420, 422 in the chemical vapour deposition reactor. This growing step results in the formation of selective but simultaneous growth of single-crystalline diamond 426 where the substrate surface is exposed and sacrificial poly-crystalline diamond material 424 where the substrate is covered by the metal mask 420, 422. The poly-crystalline diamond 424 is grown on Platinum by self-nucleation that serves a protective layer to avoid metal etching under severe environment of CVD microwave plasma. The growth of single-crystalline diamond pillars 426 is achieved by developing high growth rate chemical vapour deposition recipe with addition of nitrogen.

In step 406, the assembly of the substrate 127, the metal mask 420, 422 and the grown further diamond material 424, 426 is exposed to a sequence of metal etchants and acid boil (H2SO4+NaNO3) to remove Chromium 420 and Platinum 424. The sacrificial poly-crystalline diamond material 424 that was grown on the metal mask 420, 422 can be removed or lifted off. As a consequence, an array of high quality single-crystalline diamond membrane portions remains separated by single-crystalline diamond pillars 426.

The assembly is further processed in accordance with steps 107 to 109 as described with reference to FIGS. 2 to 5.

Figure 10:
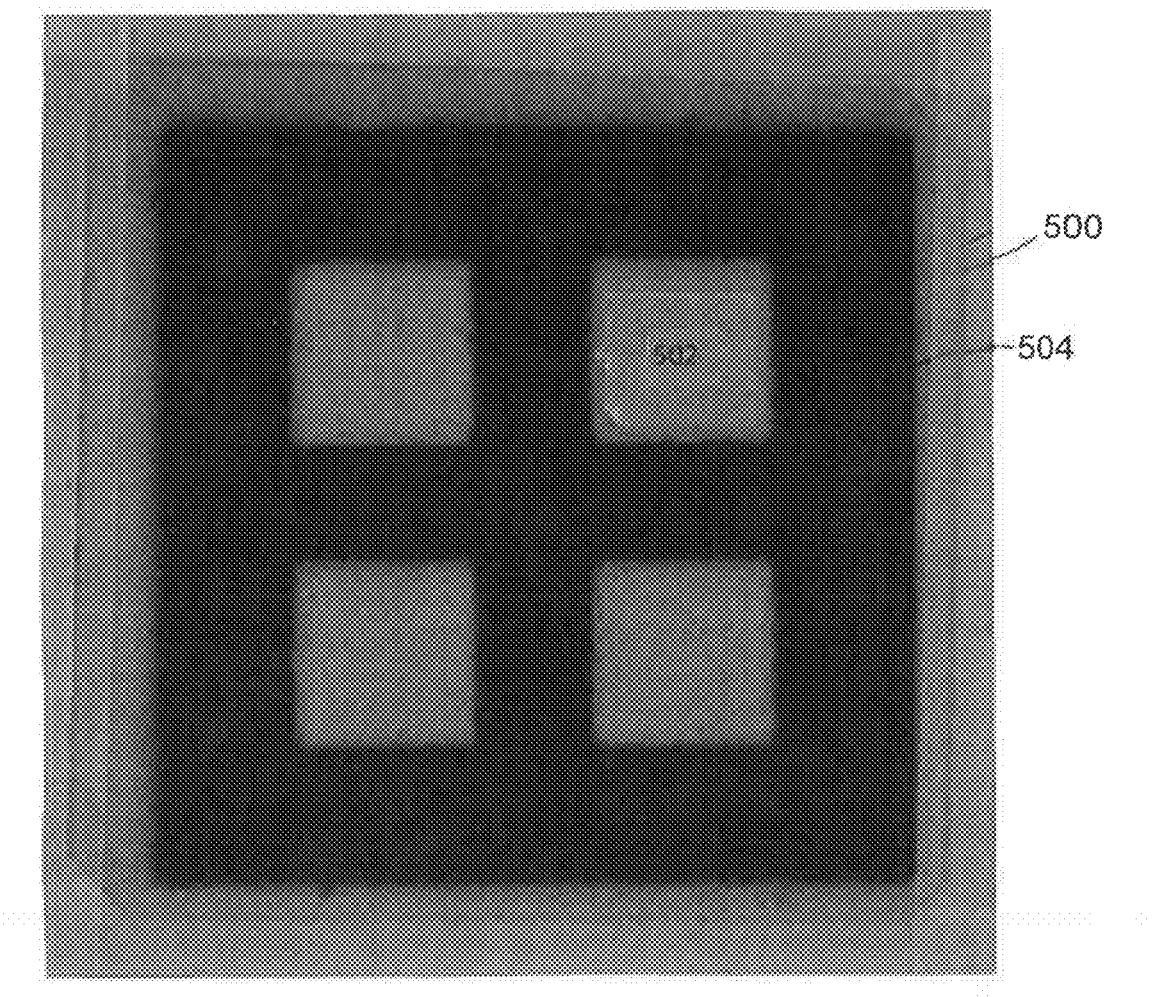
FIG. 10 is an optical micrograph of a structure fabricated in accordance with an embodiment of the present invention.
Figure 11:
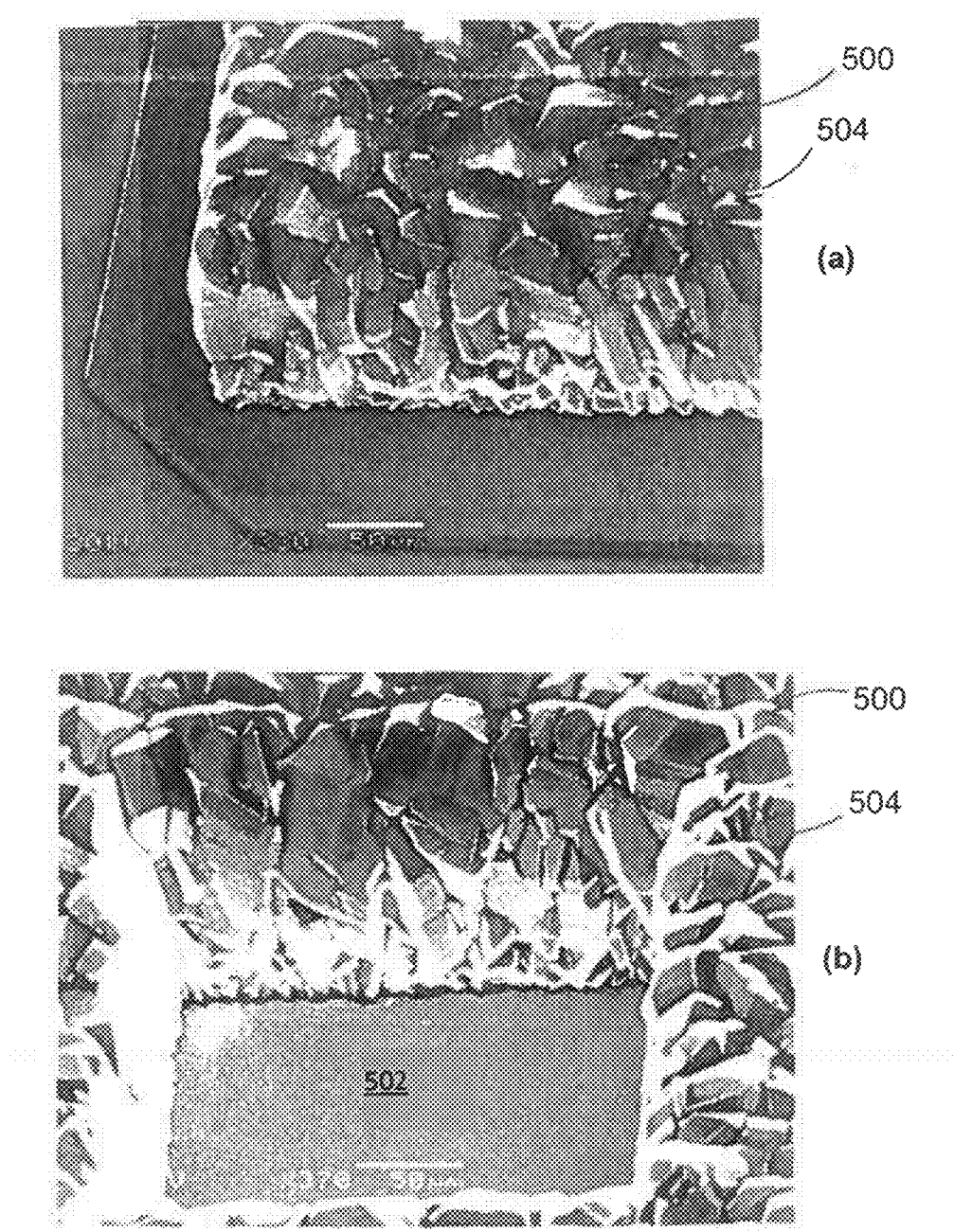
FIGS. 11 (a) and (b) are scanning electron microscopy (SEM) micrographs of portions of a structure fabricated in accordance with an embodiment of the present invention.

FIG. 10 shows an optical transmission image of a structure 500 comprising an array of four ~5 µm thick single crystalline diamond membranes 502 supported by a ~150 µm thick polycrystalline diamond support structure 504 formed in accordance with an embodiment of the present invention. FIGS. 11 (*a*) and (*b*) show scanning electron microscopy micrographs of different regions of the formed structure 500.

Figure 12:
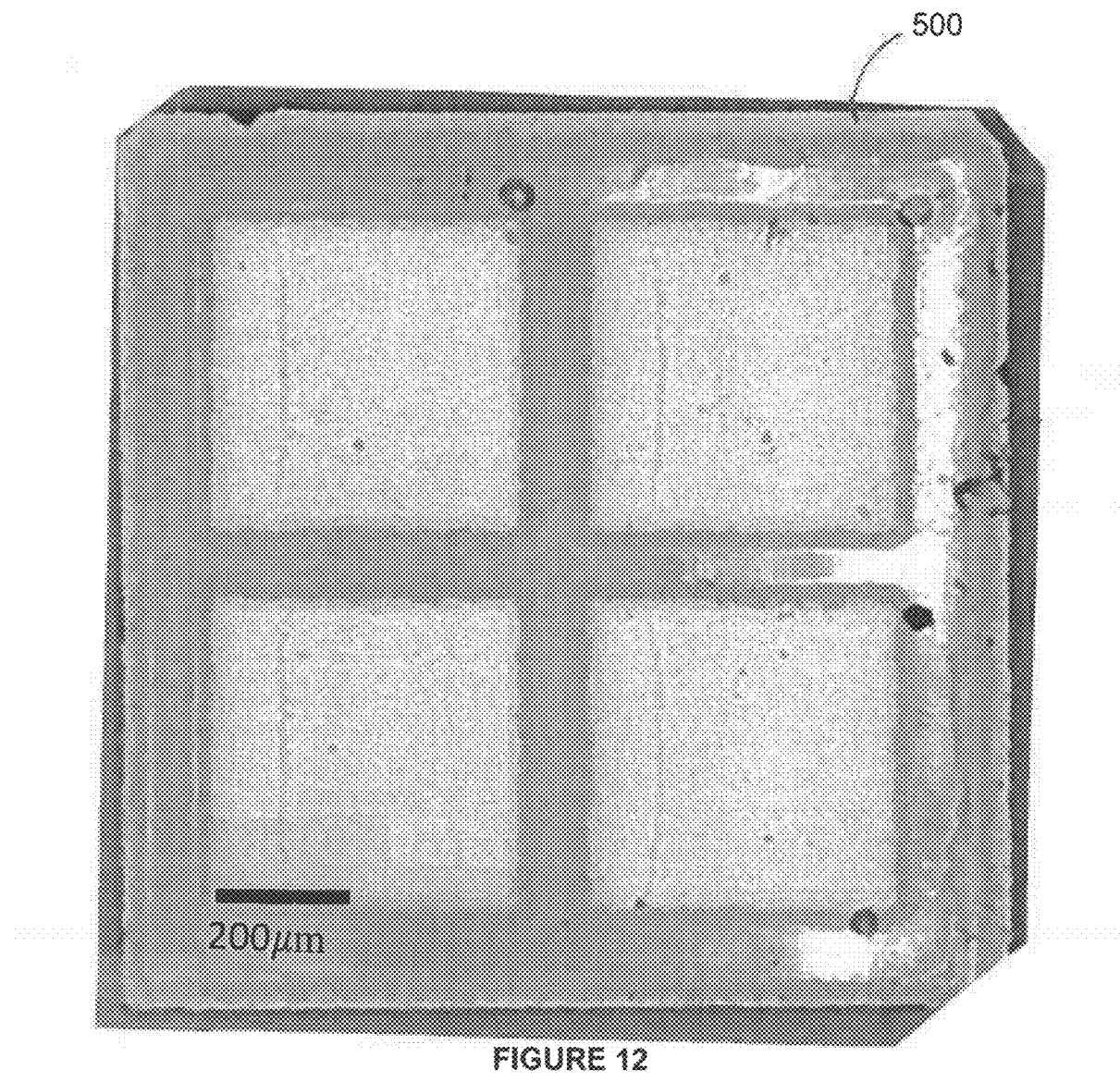
FIG. 12 is an optical micrograph of a structure fabricated in accordance with embodiment of the present invention.

FIG. 12 shows an optical micrograph of a diamond membrane structure 504 formed in accordance with an embodiment of the present invention. In this example the structure has 2×2 windows of diamond membrane portions and each window has a size of approximately 400×400 μm².

Figure 13:
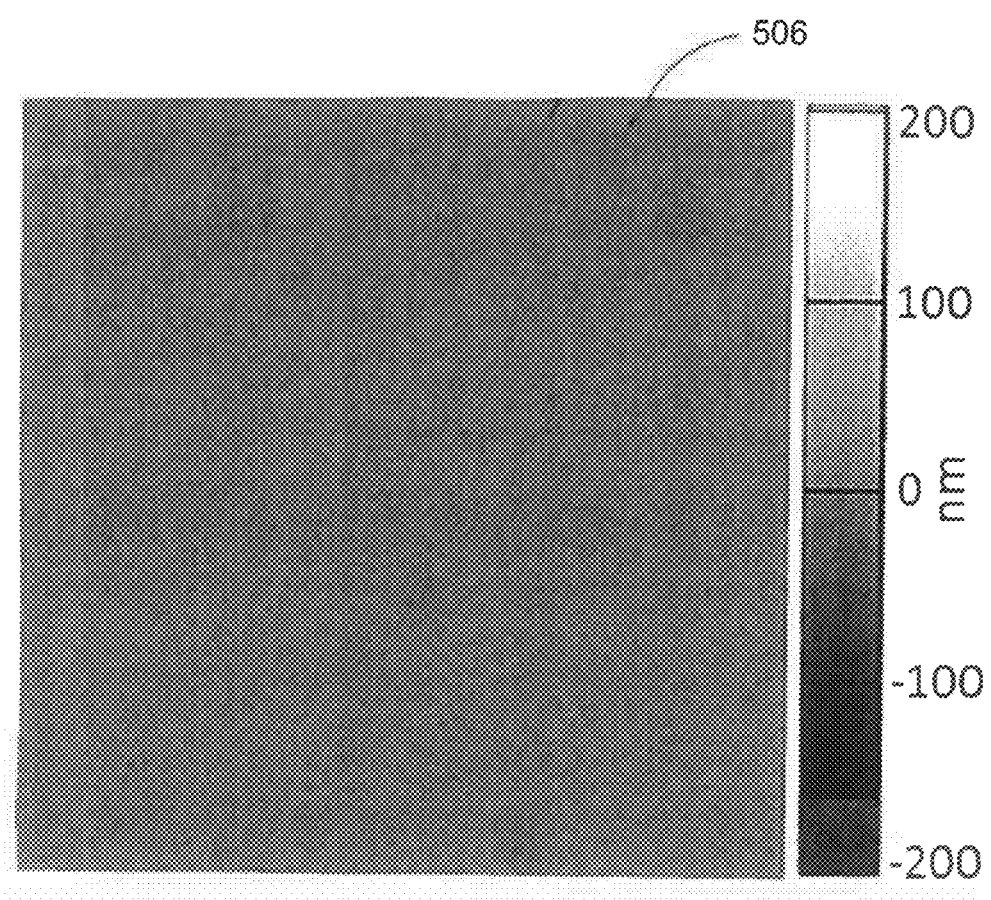
FIG. 13 is an atomic force microscopy (AFM) scan of a structure fabricated in accordance with embodiment of the present invention.

FIG. 13 is an AFM scan (scan area approximately 5×5 μm²) of a diamond membrane 506 formed in accordance with an embodiment of the present invention. The formed diamond membrane has a thickness of 300 nm with $R_{rms}$~1 nm.

Figure 14:
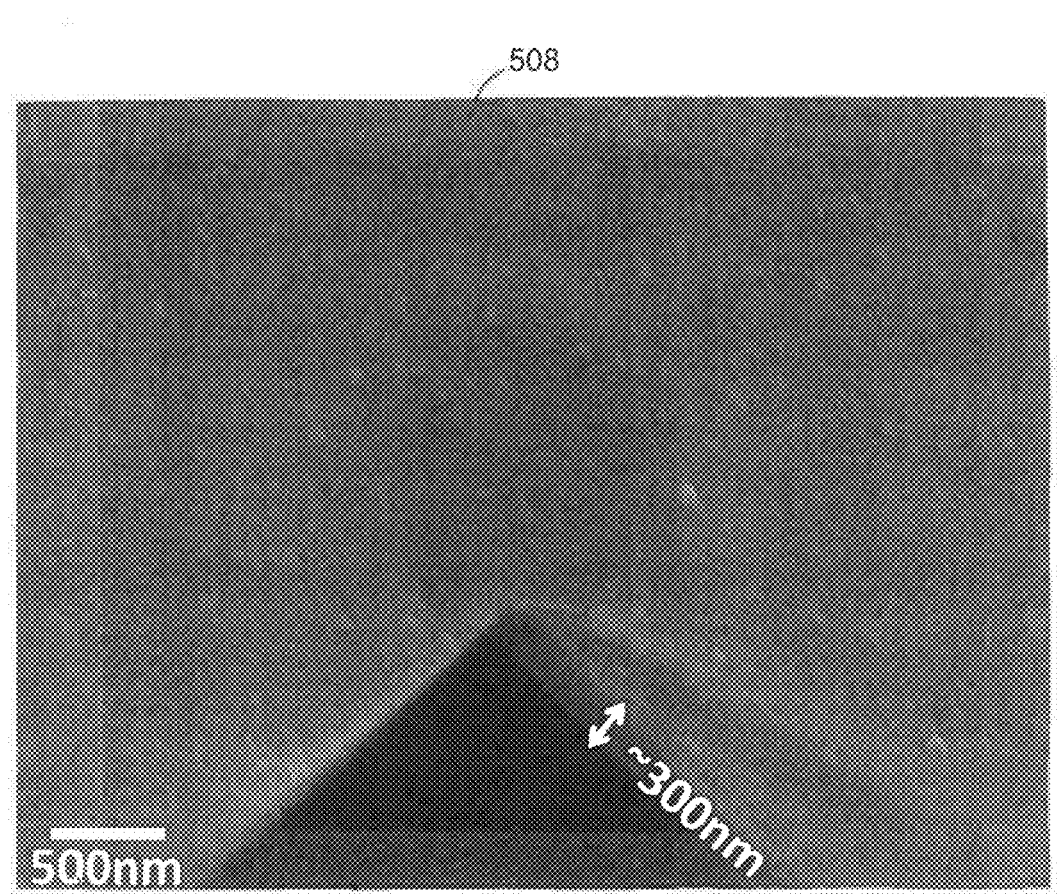
FIG. 14 is a SEM micrograph of portions of a structure fabricated in accordance with an embodiment of the present invention.
Figure 15:
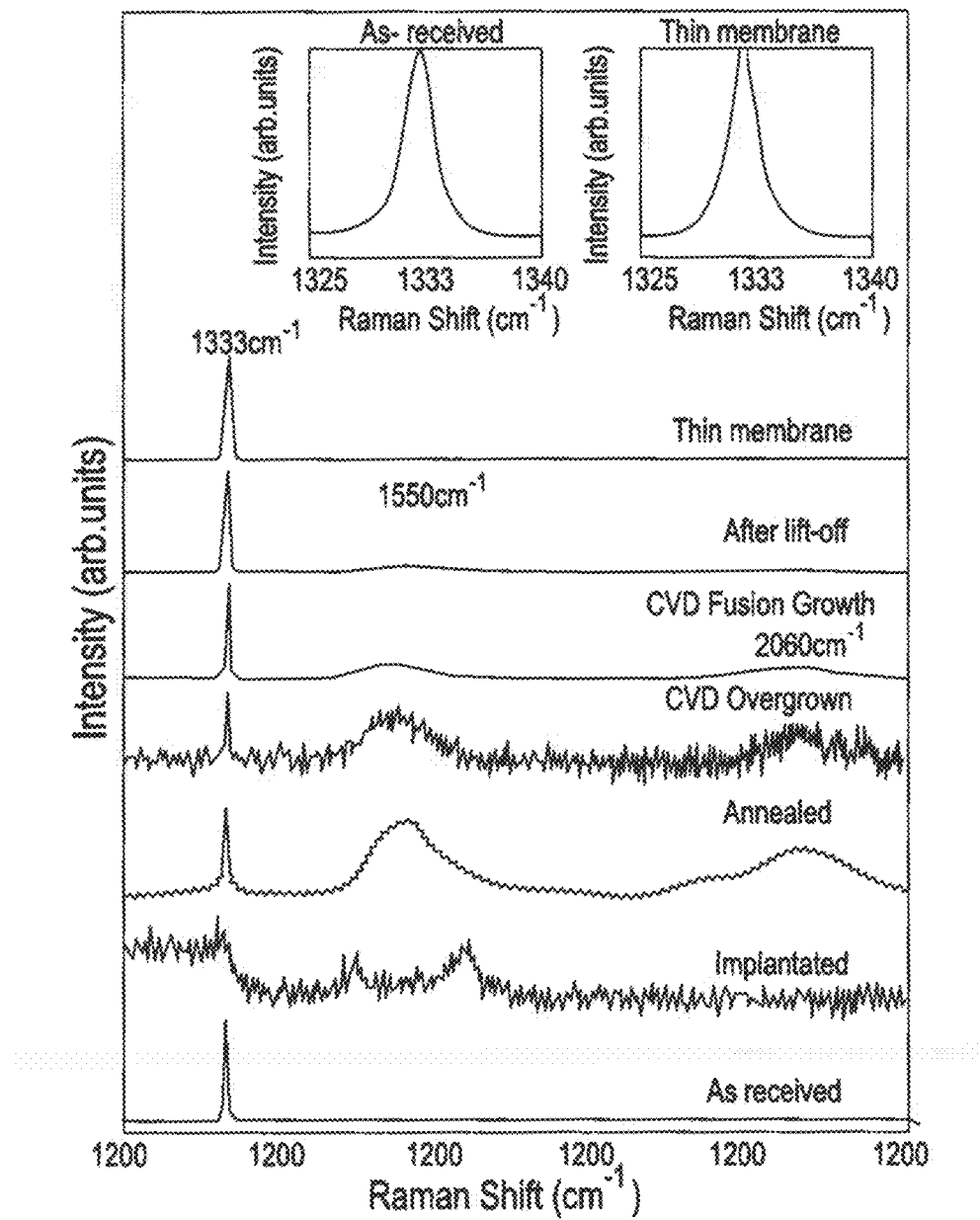
FIG. 15 shows plots of Raman data obtained after different processing steps of a method in accordance with an embodiment of the present invention.

FIG. 14 is a scanning electron microscopy micrograph of region of the diamond membrane 508 formed in accordance with an embodiment of the present invention. Again, the diamond membrane has a thickness of approximately 300 nm.

FIG. 15 shows plots of normalised Raman data taken after different processing steps of the above-described method 100. The right insert shows that the full width at half maximum (FWHM) of a ~300 nm thin diamond membrane formed by the method 100 is 2.1 cm$^{-1}$ and the left insert demonstrates that the FWHM of "as received" bulk single crystalline diamond material is 2.3 cm$^{-1}$.

The reference that is being made to a prior art publication does not constitute an admission that that prior art publication is part of the common general knowledge of a skilled person in Australia or any other country.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The claims defining the invention are as follows:

1. A method of fabricating a diamond membrane, the method comprising:
   providing a substrate and a support structure, the substrate comprising a diamond material and having a first surface, the substrate further comprising a sub-surface layer that is positioned below the first surface of the substrate and has a crystallographic structure that is different to that of the diamond material, the sub-surface layer of the substrate being positioned to divide the diamond material into first and second regions wherein the first region is positioned between the first surface of the substrate and the sub-surface layer of the substrate, the support structure also comprising a diamond material and being connected to, and covering a portion of, the first surface of the substrate, the diamond material of the support structure comprising apertures;
   coupling the diamond material of the support structure to the first surface of the substrate in a manner such that portions of the first surface of the substrate are exposed within the apertures of the diamond material of the support structure;
   growing further diamond material on the first surface of the substrate at locations within the apertures of the diamond material of the support structure or at locations around the support structure to fuse the support structure to the substrate; and
   selectively removing the second region of the diamond material from the substrate by etching away at least a portion of the sub-surface layer of the substrate whereby a diamond membrane is formed and the support structure is connected to, and supports, the formed diamond membrane.

2. The method of claim 1 wherein providing the substrate comprises growing a layer of substantially single-crystalline diamond material on the diamond material of the substrate such that a surface of the substantially single-crystalline diamond layer forms the first surface of the substrate.

3. The method of claim 1 wherein the diamond material of the support structure comprises a sheet of the diamond material comprising the apertures, wherein the apertures are formed by laser milling.

4. The method of claim 1 comprising depositing a metallic material on the first surface of the substrate to form a metallic mask having apertures.

5. The method of claim 4 comprising growing further diamond material on the first surface of the substrate and within apertures of the metallic mask to form the support structure.

6. The method of claim 4 being conducted such that polycrystalline diamond material forms on surface portions of the metallic mask.

7. The method of claim 1 wherein the first and/or the second region of the substrate is substantially single-crystalline.

8. The method of claim 1 comprising removing at least a portion of the first region of the diamond material of the substrate after removal of the second region.

9. The method of claim 1 wherein the diamond material of the support structure has a substantially single-crystalline structure.

10. The method of claim 1 wherein the support structure is arranged relative to the substrate such that portions of a fabricated membrane of the diamond material that are not covered by the support structure form windows.

11. The method of claim 1 wherein the step of providing the substrate comprises:
   providing the diamond material of the substrate; and
   forming the sub-surface layer by imposing a structural transformation on the crystallographic structure of the diamond material of the substrate.

12. A method of fabricating a diamond membrane, the method comprising:
   providing a substrate and a support structure, the substrate comprising a diamond material and having a first surface, the substrate further comprising a sub-surface layer that is positioned below the first surface of the substrate and has a crystallographic structure that is different to that of the diamond material, the sub-surface layer of the substrate being positioned to divide the diamond material into first and second regions wherein the first region is positioned between the first surface of the substrate and the sub-surface layer of the substrate, the support structure also comprising a diamond material and being connected to, and covering a portion of, the first surface of the substrate; and
   selectively removing the second region of the diamond material from the substrate by etching away at least a portion of the sub-surface layer of the substrate, whereby a diamond membrane is formed and the support structure is connected to, and supports, the formed diamond membrane;
   wherein providing the substrate and the support structure comprises growing the support structure on the substrate, wherein growing the support structure on the substrate comprises placing a mask having a plurality of apertures on the first surface of the substrate such that portions of the first surface of the substrate are exposed within the apertures.

13. The method of claim 12 comprising growing further diamond material on the first surface of the substrate and within the plurality of apertures of the mask to form the support structure.

14. The method of claim 13 wherein the mask comprises diamond material that is polycrystalline.

* * * * *